United States Patent [19]

Takagi et al.

[11] Patent Number: 4,837,428
[45] Date of Patent: Jun. 6, 1989

[54] DRIVING CIRCUIT FOR LASER DIODE

[75] Inventors: Yasutomo Takagi; Kazuyoshi Takaishi, both of Tokyo, Japan

[73] Assignee: Ando Electric Co., Ltd., Tokyo, Japan

[21] Appl. No.: 153,108

[22] Filed: Feb. 8, 1988

[30] Foreign Application Priority Data

Feb. 6, 1987 [JP] Japan .................. 62-25719

[51] Int. Cl.⁴ .................................. G06F 11/00
[52] U.S. Cl. ...................... 250/205; 372/29; 372/31
[58] Field of Search ............... 250/205; 307/311; 315/149–151, 156; 372/29, 31, 38

[56] References Cited

U.S. PATENT DOCUMENTS

| | | | |
|---|---|---|---|
| 4,158,132 | 6/1979 | O'Dell | 250/205 |
| 4,580,044 | 4/1986 | Hongo et al. | 372/31 |
| 4,592,057 | 5/1986 | Comerford | 372/31 |
| 4,612,671 | 9/1986 | Giles | 372/31 |
| 4,744,087 | 5/1988 | Nicia | 372/29 |
| 4,771,431 | 9/1988 | Nakazawa et al. | 372/38 |

Primary Examiner—David C. Nelms
Assistant Examiner—Stephone Allen
Attorney, Agent, or Firm—Seidel, Gonda, Lavorgna & Monaco

[57] ABSTRACT

A laser diode power supply that uses a variable voltage as an input driving signal to provide a programmable laser diode output control instead of a constant reference voltage. The power supply includes a detector that samples light emitted from the laser diode, a controllable power supply that is capable to be operated by CPU, a current - voltage converter and a differential amplifier to which the output of the former two devices are applied.

3 Claims, 5 Drawing Sheets

DRIVING CIRCUIT FOR LASER DIODE

BACKGROUND OF THE INVENTION

1. Field of the Invention

The present invention relates to a driving circuit for laser diode. More particularly, it relates to a driving circuit for laser diode which supplies controllable voltage to the laser diode to provide a variable output intensity of laser diode.

2. Description of the Prior Art

A driving circuit for laser diode which regulates the intensity of the laser output has been employed, which is called hereinafter an APC circuit. The APC circuit is composed from the devices of; sampling a fraction of light emitted from the laser diode, controlling a driving current to be inputted to a diode driver for laser diode by output signal from aforesaid sampling device in order to regulate the intensity of the laser output. According to the present invention, a controllable input voltage is employed instead of a reference voltage in the prior art to provide variable output intensity of the laser diode.

FIG. 4 illustrates a sample of a block diagram of an APC circuit in the prior art. It is composed from a photo detector (1), a current - voltage converter (2), a differential amplifier (3), a reference voltage generator (4), a diode driver (5) and a laser diode (6).

FIG. 5 demonstrate the characteristics of the driving current versus output intensity of a laser diode. It distinctly shows the fact that even when the same driving current is supplied to the laser diode (6), the obtained output intensity of laser diode is larger for lower temperature. This is the reason why the APC circuit is required, which operate to regulate an input current to be applied to laser diode (6) in order to maintain the output intensity of laser diode (6) at a constant level.

FIG. 4 is a sample of the APC circuit which has the function to maintain the constant output intensity of laser diode (6).

The photo detector (1) samples a fraction of light emitted from the laser diode (6). An output current of aforesaid photo detector (1) is converted to voltage by the current - voltage converter (2), then it is introduced to a differential amplifier (3).

For example, when output intensity of laser diode (6) is 1 mW, the photo detector generates a output current of about 0.1 mA through said sampling.

The output of the reference voltage generator (4) is supplied to the other terminal of the differential amplifier (3). Then the differential amplifier (3) boosts the difference between output of the reference voltage generator (4) and output voltage of the said current - voltage converter (2) in order to supply an output signal to a diode driver (5).

For example, the differential amplifier (3), with the reference voltage generator (4) of 0.8 V, may meet the below condition that: the output of differential amplifier (3) is $-8$ V when an input voltage of 0.8 V is applied from the current - voltage converter (3), it becomes $-9$ V when the input voltage is changed to 0.9 V, and the output of said differential amplifier (3) varies to $-7$ V when it receives the input of 0.7 V from current - voltage converter (2). Thus, the output of differential amplifier increases or decreases according as the corresponding output of current - voltage converter (2) decreases or increases.

The diode driver (5) feeds the driving current to the laser diode (6).

FIG. 4 illustrates a feedback loop comprising laser diode (6), photo detector (1), current - voltage converter (2), differential amplifier (3), diode driver (5) and laser diode (6) to regulate the output intensity of laser diode (6).

The output intensity of laser diode (6) becomes stable according as the output voltage of the current - voltage converter (6) gets close to that of the reference voltage generator (4), and it is most stable when the two voltages get equivalent.

However, heretofore, according to the APC circuit indicated in FIG. 4 in the prior art, though it is capable of regulating the output intensity of laser diode (6), it cannot manipulate the output intensity. To adjust the different intensity, it requires an apparatus such as an optical attenuator.

In the higher accuracy measurement such as of the loss characteristics of optical fiber or the level characteristics of optical devices, the results tend to be affected by the intensity level of light source to be employed for it. Heretofore, to introduce variations in input intensity level in the prior art, it has been a practice to insert the various optical attenuators in the measurement system or to change resistance of negative feedback of the current-voltage converter (2) in FIG. 4. However, there have been a problem in case of employing the optical attenuators, that since the connecting loss of light connector can vary from one measurement to another, a high enough accuracy could not be attained.

The prior art technique of changing the resistance of negative feedback circuit is disclosed, for example, in Japanese patent application Kokai No. 180346/85. However, in this case, it took some time and trouble to change the resistance for each measurement.

THE BRIEF DESCRIPTION OF THE FIGURES

THE PURPOSE OF THE INVENTION

Figure 4:
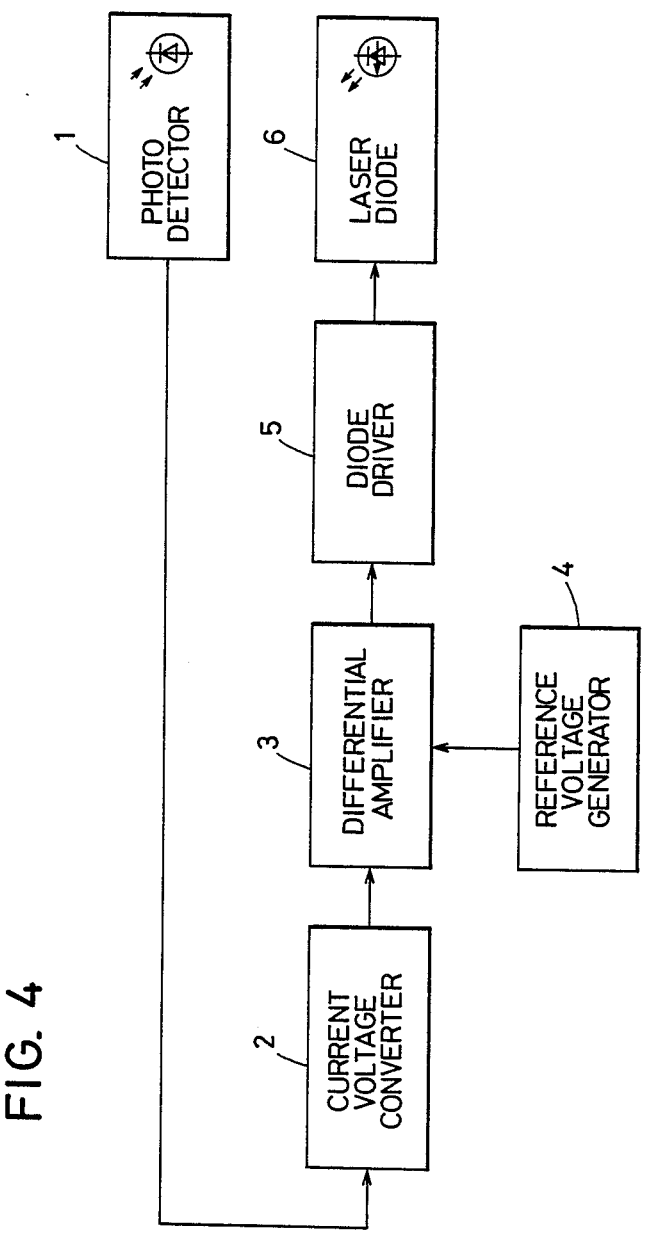
FIG. 4 is a block diagram which illustrates a block diagram of the driving circuit for laser diode of the prior art.
Figure 5:
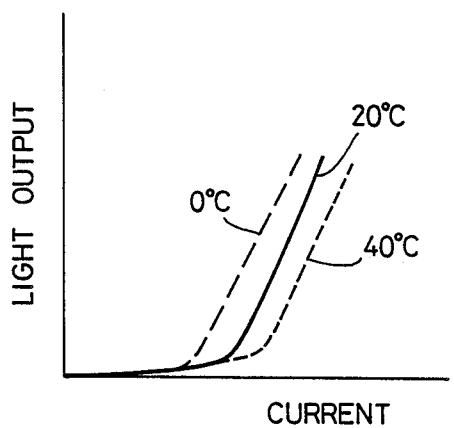
FIG. 5 is a graph which demonstrates the photo output intensity characteristic of a laser diode as a function of input driving current at the temperature indicated.

An object of the present invention is to provide a driving circuit for laser diode which can control the output intensity of the laser diode applied through a variable voltage supplier which is employed instead of a reference voltage generator in FIG. 4.

The following examples are given merely to aid in the understanding of the present invention, and variations may be made by one skilled in the art without departing from the spirit and scope of the present invention.

DESCRIPTION OF THE PREFERRED EMBODIMENT

Figure 1:
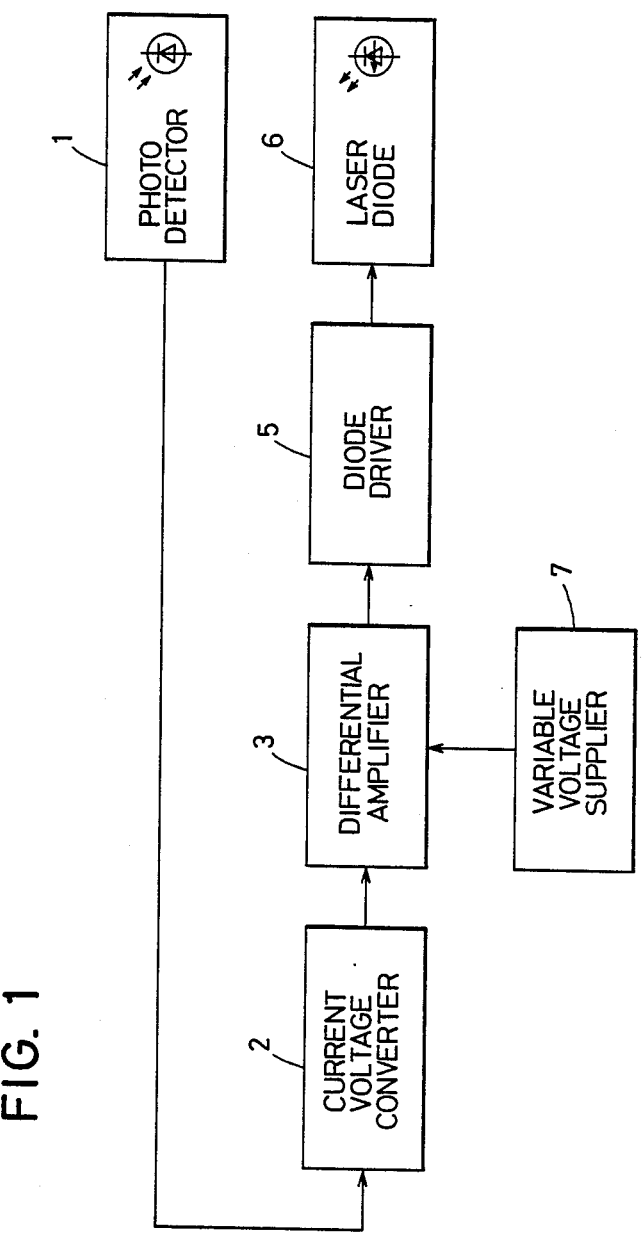
FIG. 1 is a block diagram which illustrates the example of the driving circuit for laser diode of the present invention.

FIG. 1 illustrates the example of the block diagram of the present invention. A variable voltage supplier (7) is introduced and the other elements are exactly the same as in FIG. 4. That is to say, in FIG. 1 a variable voltage supplier is employed in the circuit instead of a reference voltage generator (4) of FIG. 4. In response to the variation of the output of voltage supplier (7), which is applied to the input of the differential amplifier (3), the output voltage of the differential amplifier (3) varies and thereby the output intensity of laser diode is changed.

In this embodiment the output voltage level of the current - voltage converter (2) is caused to be equalized to that of the variable voltage supplier in order to stabilize the output intensity of the laser diode.

Figure 2:
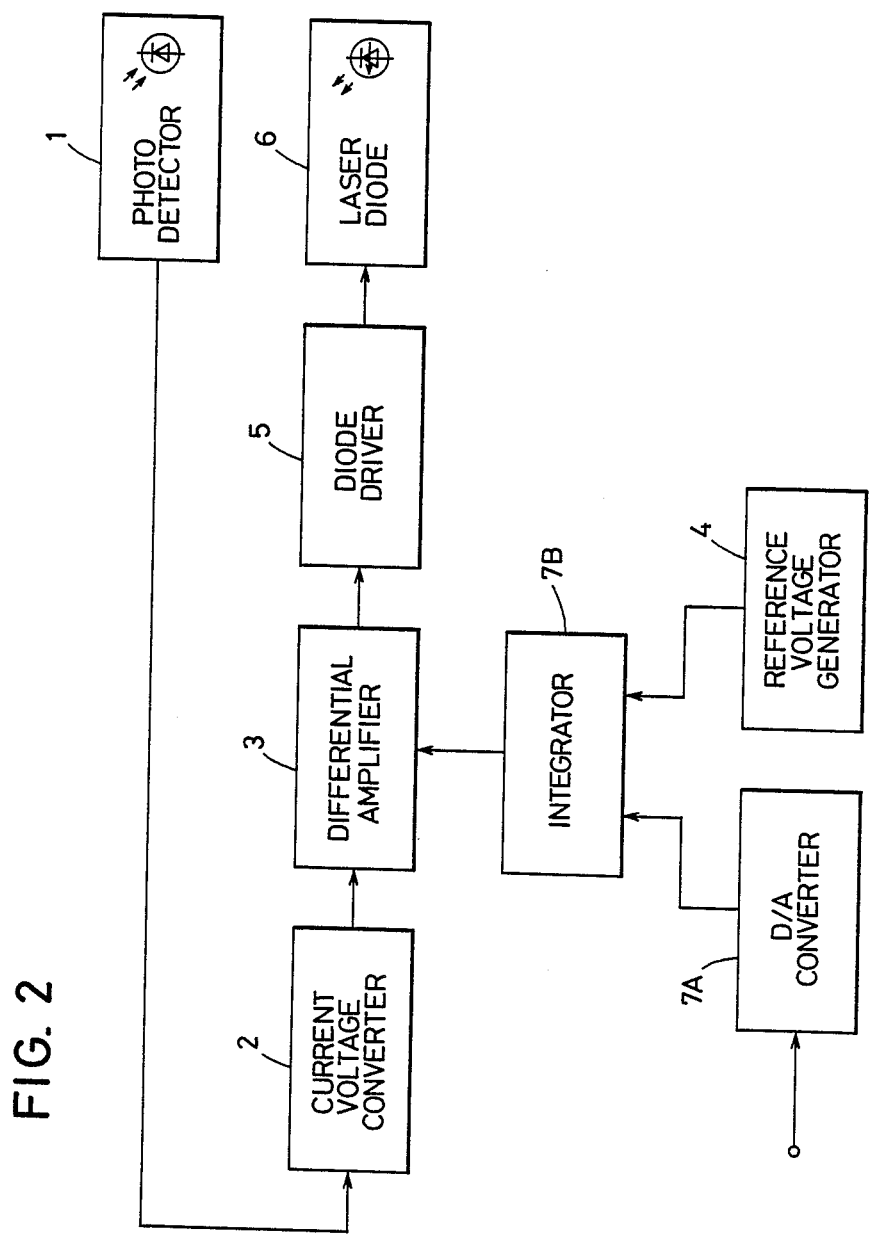
FIG. 2 is a block diagram which illustrates the driving circuit including one example of the controllable voltage supplier (7) of the present invention.

Hereinafter, an example of the controllable voltage supplier (7) is explained in FIG. 2. A D/A converter (7A) and an adder (7B) are shown in FIG. 2. The D/A converter converts an input signal from digital to analog. According as the input digital signal is changed, the output analog signal of D/A converter (7A) can be varied.

The adder (7B) adds outputs from the reference voltage generator (4) and from the D/A converter (7A) and applies the output to the input of the differential amplifier (3). In the case in FIG. 2, the output of said adder (7B) is 0.9 V when the reference voltage is 0.8 V and output voltage of said D/A converter (7A) is 0.1 V. FIG. 2 illustrates the circuit of the present invention including the controllable voltage supplier composed by the addition of D/A converter (7A) to the reference voltage generator (4) to provide the controllable output voltage which is varied by the input data to be applied to the D/A converter (7A).

Figure 3:
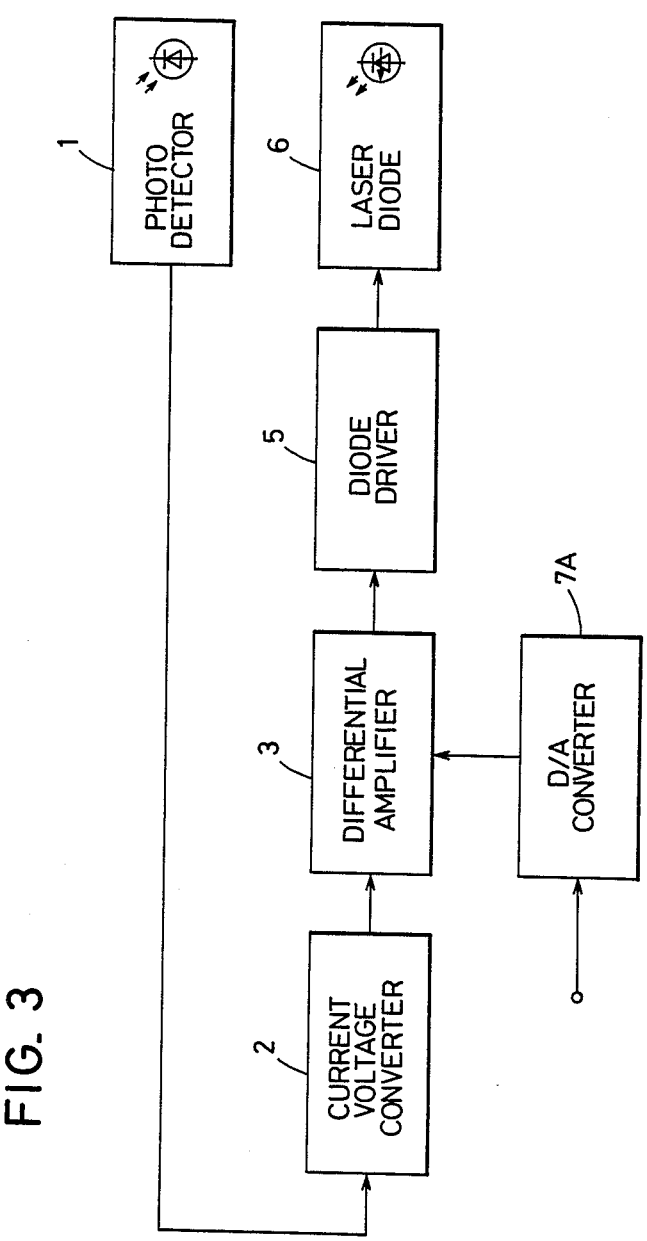
FIG. 3 is a block diagram which illustrates the driving circuit including another example of the controllable voltage supplier (7) of the present invention.

Hereinafter, another example of said controllable voltage supplier is explained in FIG. 3. It illustrates the circuit which is composed said controllable voltage (7) only by the D/A converter (7A) of the FIG. 2.

Since the input data which is applied to the D/A converter (7A) can be prepared by micro processor unit or other digital processors, the programmable control of output intensity of laser diode (6) can easily be obtained.

In accordance with the present invention, it provides a variable output intensity of laser diode in a stable condition by introducing a controllable reference voltage in place of a fixed reference voltage of a APC circuit. It also provides an easier operation for a variable voltage due to a capability of a programmable - control than the prior art which has been accomplished by changing resistance of the measurement system.

What is claimed is:

1. A driving circuit for a laser diode including;
   (A) a detector for sampling light emitted from the laser diode,
   (B) a current- voltage converter to which is inputted the output of said detector,
   (C) a voltage supplier capable of generating a variable output,
   (D) a differential amplifier to which is inputted the output of said current - voltage converter and from the output of said variable voltage supplier, to provide an output for driving said laser diode, whereby the output intensity of the laser diode in controlled by the variable output of the voltage - supplier through feedback loop.

2. A driving circuit for laser diode of claim 1 wherein said variable voltage supplier comprises a D/A converter, a reference voltage generator and an adder which adds the output voltage of said D/A converter and the output voltage of said reference voltage generator, the variable voltage is controlled by an input data to be applied to said D/A converter.

3. A driving circuit for laser diode of claim 1 wherein said variable voltage supplier comprises a D/A converter whereby the variable voltage is controlled by input data to be applied to said D/A converter.

* * * * *